United States Patent [19]
Heinemann et al.

[11] Patent Number: 5,180,948
[45] Date of Patent: Jan. 19, 1993

[54] PLASMA GENERATOR WITH SECONDARY RADIATOR

[75] Inventors: Michael Heinemann, Muenster; Bernhard Soeder, Seeheim-Jugenheim; Wolfgang Meier, Muenster, all of Fed. Rep. of Germany

[73] Assignee: Roehm GmbH Chemische Fabrik, Darmstadt, Fed. Rep. of Germany

[21] Appl. No.: 843,160

[22] Filed: Feb. 28, 1992

[30] Foreign Application Priority Data

Mar. 1, 1991 [DE] Fed. Rep. of Germany ... 9102438[U]

[51] Int. Cl.$^5$ .............................................. H05H 1/00
[52] U.S. Cl. .......................... 315/111.21; 313/231.31; 333/99 PL
[58] Field of Search ................ 315/34, 111.01, 111.21, 315/111.41, 175, 326; 313/231.31; 250/423 R, 423 F; 333/99 PL

[56] References Cited

U.S. PATENT DOCUMENTS

| | | | |
|---|---|---|---|
| 4,810,935 | 3/1989 | Boswell | 313/231.31 X |
| 4,902,934 | 2/1990 | Miyamura et al. | 315/111.21 X |
| 4,940,015 | 7/1990 | Kobashi et al. | 315/111.21 X |
| 5,111,111 | 5/1992 | Stevens et al. | 315/111.21 X |

FOREIGN PATENT DOCUMENTS 0129490 12/1984 European Pat. Off. .
0279895 8/1987 European Pat. Off. .
0402282 12/1990 European Pat. Off. .
2583250 12/1986 France .

OTHER PUBLICATIONS

Patent Abstracts of Japan, vol. 15, No. 68(C-807), Feb. 18, 1991, & JP-A-294491, Dec. 5, 1990, K. Watanabe, et al., "Microwave Plasma Treating Device".

Primary Examiner—Robert J. Pascal
Attorney, Agent, or Firm—Oblon, Spivak, McClelland, Maier & Neustadt

[57] ABSTRACT

The present invention is directed to a plasma generator which can generate a localized plasma. To localize the plasma, a low pressure plasma generator, containing a vacuum chamber and at least one microwave radiation source, which does not by itself produce a field strength sufficient to form plasma in the vacuum chamber, is equipped with at least one aerial for the radiation of microwaves. This at least one aerial acts as a secondary radiator in the vacuum chamber and can generate a localized plasma at its free tips.

10 Claims, 5 Drawing Sheets

PLASMA GENERATOR WITH SECONDARY RADIATOR

BACKGROUND OF THE INVENTION

1. Field of the Invention

The present invention is directed to a low pressure plasma generator with a localizable plasma combustion chamber.

2. Discussion of the Background

Treatment with low pressure plasmas is an important new method for modifying the surfaces of solid bodies. The surfaces can be, e.g., etched, i.e., partially removed, or activated, i.e., in an energy-rich state that is suitable for extensive modifications, or are coated by bonding gaseous substances. For all of these methods, the surface to be modified must be subjected to a plasma. As is well-known, a gas comprising excited molecules, radicals or ions is referred to as a plasma.

Plasmas can be generated at low gas pressures by means of microwave radiation. A prerequisite for the formation of a plasma is an adequately high field strength of the radiation. However, the field strength is the greatest in the immediate vicinity of the source of radiation and decreases with increasing distance therefrom. Therefore, the plasma may exist only in the vicinity of the source of radiation.

The uniform treatment of large surfaces or surfaces with complicated shapes with a plasma causes considerable difficulties. For reasons relating to their design and their energy supply, available sources of radiation cannot be disposed at any point and at any position in a low pressure chamber. Similarly, the surface to be treated cannot be moved to specified locations in the plasma combustion chamber. Therefore, the surfaces to be treated cannot be located near the plasma source.

The ability to ignite and maintain a plasma at a predetermined place, where it is supposed to unfold its technological effect, is called localization. The precise localization of plasma is of great importance primarily when a large surface is to be treated uniformly. This goal can be largely reached if one can succeed in localizing a plasma linearly and moving the plasma uniformly over the surface to be treated. For this purpose, either the plasma can be localized stationarily and the substrate can be moved relative thereto or the substrate can remain stationary and the plasma is moved at right angles to its longitudinal extension. However, just the linear localization of a uniform plasma causes considerable difficulties.

The literature reports on various possibilities for localizing microwave plasmas. These include, among others, the ignition of the plasma behind the inlet window for the microwave (Wertheimer et al., Thin Solid Films, 115 (1984), 109), the ignition of primary transmitting aerials (Alcatel DVM, 92240 Malakoff, France, machine GIR 820), the ignition by means of local pressure differences in a vacuum chamber (IKV reports, Mr. Ludwig) and the magnetic confinement with or without the utilization of an electron cyclotron resonance absorption (EP-A 279 895). Some of these possibilities were also used for localizing large area plasmas.

The use of surface waveguide structures, which are mounted outside the vacuum apparatus but which are in front of a microwave permeable window, allows a large area plasma to be ignited (Kieser et al., Thin Solid Films, 118 (1984), 203).

All of the described methods of localization have drawbacks that stand in the way of their practical application. The drawback of the arrangement described last is that the plasma burns only directly behind the window and cannot be moved within the vacuum to any arbitrary place therein by the operator. In the case of a coating plasma, the window is also coated, a feature that can lead to an absorption and reflection of the microwaves depending on the properties of the deposited layer. Long setting-up times then become necessary owing to the repeated cleaning or exchanging of the windows.

An ignition at a primary transmitting aerial yields a plasma whose intensity in most cases exhibits local inhomogeneities owing to the wavelength of the transmitting frequency (e.g., with a period of 12 cm at a frequency of 2.45 GHz). In this arrangement, compensating devices such as a mechanical movement of the aerial can hardly be used owing to the design of primary transmitting aerials The ability to localize a plasma by means of local pressure differences is limited to the coating of largely closed bodies. This is a suitable method for coating bottles internally. However, in trying to process a flat substrate with such a system grave technological problems arise.

One successful method is magnetic confinement. This process is used, e.g, in the sputter technique. However, an effective magnetic confinement in achieved only if the gyration radius of the charged particles in the plasma with respect to the free path cannot be ignored. This is the case for conventional permanent magnets made of ferrite only below pressures of about 0.1 mbar.

With plasmas of higher pressures—of up to a few millibars—higher etching and deposition rates can be obtained during the etching and coating process. For this reason there is a need for a method for plasma confinement that also has a good localizability at higher pressures and thus allows homogeneous etching or formation of layers at simultaneously high etching and deposition rates.

SUMMARY OF THE INVENTION

Accordingly, one object of the present invention is to provide a novel low pressure plasma generator with a localizable plasma combustion chamber.

The present invention achieves this object because it has been found by the Applicants of the present invention that a low pressure plasma generator that contains a vacuum chamber and at least one microwave radiation source solves the problem posed if at least one aerial for the microwave radiation is disposed in the vacuum chamber. The aerial acts as a secondary radiator; its function comprises the absorption of the microwaves and the generation of local, large field strengths, which lead to the ignition of a plasma in the immediate vicinity of the aerial.

According to the present invention, microwaves are irradiated into a vacuum chamber through one or more windows. It is important that the surface power density of the irradiated microwaves do not suffice to ignite a plasma at the windows. This would lead to an undesired absorption and reflection of the microwaves. By irradiating the vacuum chamber with microwaves through an arbitrary number of windows, sufficient power can be supplied to generate at the secondary radiator a field strength that is sufficient to locally ignite the plasma.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 7:
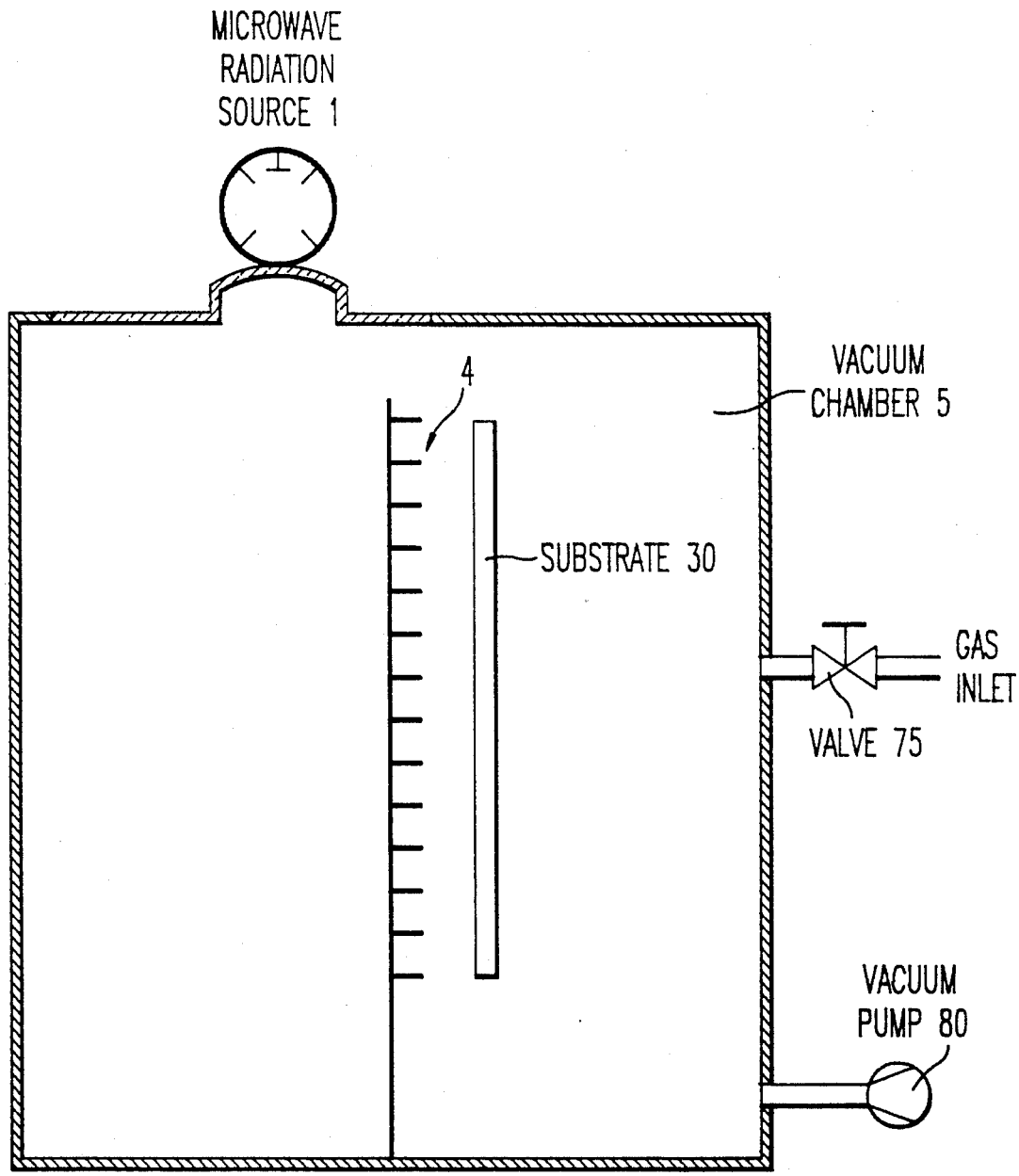
FIG. 7 is a schematic drawing of a plasma combustion device which can incorporate the system of the present invention.

Referring now to the drawings, wherein like reference numerals designate identical or corresponding parts throughout the several views, and more particularly to FIG. 7 thereof, which shows an overall device to implement the system of the present invention.

That is, as shown in FIG. 7, the system of the present invention is operable with a device which utilizes a microwave generation source 1 which irradiates microwave radiation into a vacuum chamber 5 to subject a substrate 30 to a plasma. In the device of the present invention, it is important that the surface power density of the irradiated microwaves is not great enough to ignite a plasma in the vacuum chamber 5. That is, according to the present invention, the microwave radiation source 1 should operate at a power such that it does not itself produce a field strength sufficient to form plasma within the vacuum chamber 5. If the microwave radiation source 1 operates at a power sufficient to form a plasma, this would lead to an undesired absorption and reflection of the microwaves. Instead, according to the present invention, a secondary radiator system 4 is disposed within the vacuum chamber to generate at the secondary radiator system 4 a field strength that it sufficient to locally ignite the plasma at the secondary radiator system 4.

According to the present invention, the microwave radiation source 1 may be of a customary design and operate at a frequency ranging from 1 to 15 GHz and is disposed preferably outside of the vacuum chamber 5. Preferred is a microwave radiation source operating at a frequency of 2.45 GHz, which corresponds to a wavelength of 122.5 mm in the vacuum. The radiation can be bunched into the vacuum chamber through a vacuum-sealed window made of a microwave-permeable material, e.g., Duran ® glass. Gas is input into the vacuum chamber 5 from a gas inlet port through valve 75 and a vacuum pump 80 is also connected to the vacuum chamber 5.

Figure 1A:
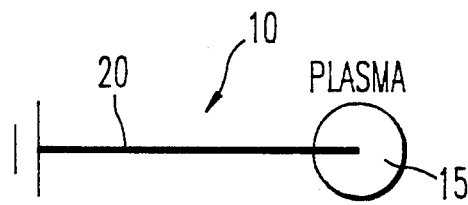
FIG. 1 is a schematic drawing of a Hertzian dipole as a secondary radiator.
Figure 1B:
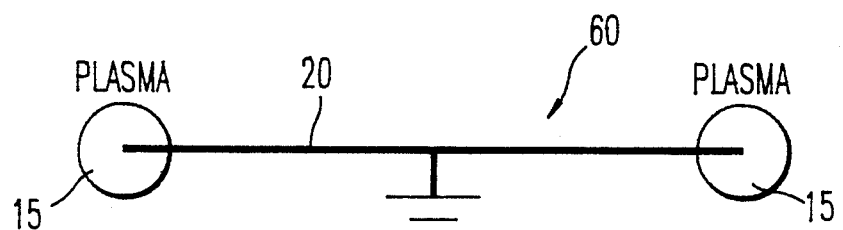

The present invention disposes in the vacuum chamber 5 an aerial which acts as a secondary radiator which is suitable for absorbing the irradiated microwave radiation. Expedient is an aerial whose length corresponds to a quarter wavelength or four times the wavelength. A possible secondary radiator is, e.g., a Hertzian dipole, as shown in FIG. 1, such as a one quarter wavelength secondary radiator 10, FIG. 1(a), or a half wavelength secondary radiator 60, FIG. 1(b), having an aerial and disposed in a vacuum chamber. When utilizing the half wavelength secondary radiator 60, it is grounded in the center of the dipole, as shown in FIG. 1(b), and a standing wave is formed in such a manner that the electrical field strength at the secondary radiators is at a maximum and the current there is at a minimum. Owing to these high electrical field strengths, a plasma ignites at the free ends 15 of the secondary radiators which are connected to connecting lines 20. This plasma burns in a pressure range from about 0.05 mbar up to over 50 mbar. The expansion of this ball-like plasma on the free ends 15 of the dipole depends on the pressure in the vacuum chamber and on the power of the microwave.

In place of a Hertzian dipole, any other aerial arrangement can be used that, on the one hand, absorbs the microwaves and, on the other hand, generates locally a sufficiently high field strength.

Figure 2:
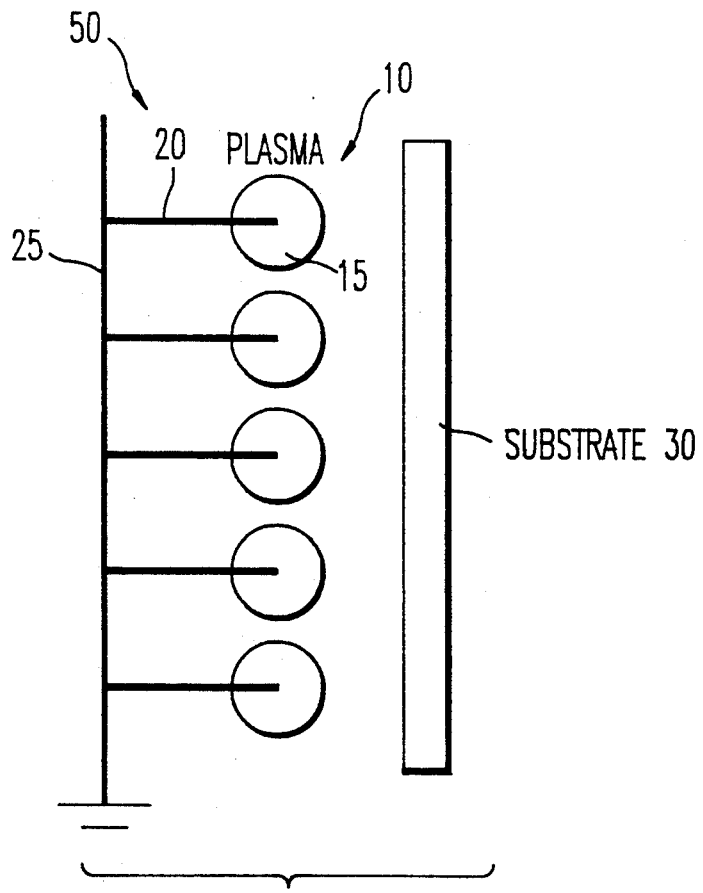
FIG. 2 shows a comb radiator formed by several aerials.
Figure 4A:
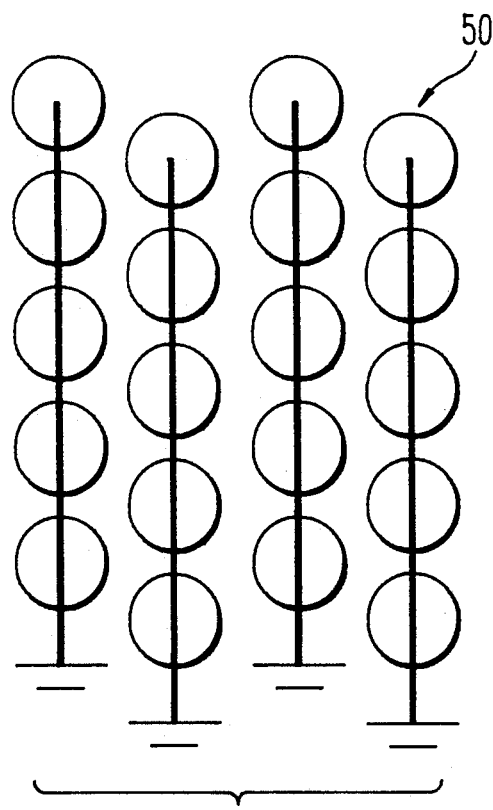
FIG. 4 is a schematic, top and side view of a flat top radiator formed by four comb radiators.
Figure 4B:
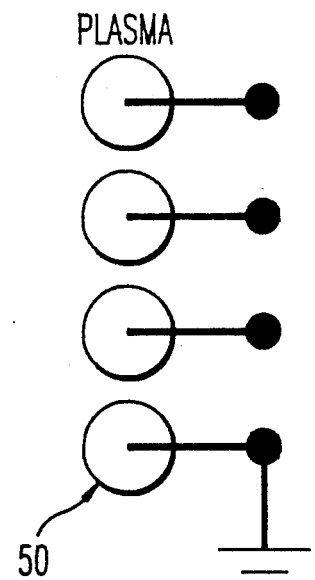

One alternative secondary radiator that can be used is a comb radiator 50 which features a plurality of aerials 10 which can be attached, as shown in FIG. 2, to a common electric guide 25 or ground. Preferably the aerials 10 are spaced $\frac{1}{4}$ to 1/20 of a wavelength apart substantially parallel to each other on the common guide 25. The connecting lines 20 of the free aerial tips 15 define approximately the central axis of the plasma combustion chamber. The free aerial tips 15 can lie on a continuous curve, e.g., a straight line, thus obtaining a linear plasma with which the surface of a substrate 30 can be covered with a suitable profile. A plurality of comb radiators 50, all of which are attached to a common guide 25, can be arranged as shown in FIGS. 4(a) and 4(b), FIG. 4(a) showing a side view and FIG. 4(b) showing a top view, so that the free aerial tips 15 lie in a plane, see FIG. 4(b), or in a continuous curved surface, see FIG. 4(a). With such an arrangement, the shape of the plasma combustion chamber can be optimally adapted to the surface shape of the respective substrate.

A large area plasma with such secondary radiators can be produced in different ways. First, several secondary radiators, all of which usually have the same length, may be arranged in the vacuum chamber. Their spherical plasmas may overlap to form a large area plasma, as results from the structure shown in FIG. 2. When configuring the secondary radiators, one must take into consideration that the secondary radiators in turn emit electromagnetic radiation. When several secondary radiators are used, this can lead to the waves overlapping. This effect can be utilized to produce plasmas that are as uniform as possible by selecting configurations of secondary radiators that yield uniform radiation. Such a configuration of aerials can be designed, e.g., as a comb, as a cutting edge or as a Yagi aerial.

What is understood is that an aerial comprising several dipoles that are coupled together can be constructed in several ways, whereby the receiving and radiating characteristics can be changed based on the specific construction.

Secondary radiators of the kind described above can be disposed anywhere in the vacuum chamber. As a consequence, it is possible to localize the plasma thus generated at any arbitrary place in the vacuum chamber.

The proposed system of the present invention is not limited to the treatment of a flat substrate. By adapting the shape of the secondary radiators to match, irregularly shaped components with complicated geometries can also be modified by being subjected to a plasma. Web-shaped substrates can be guided, according to the present invention, through a burning plasma by means of a transport device (not shown) disposed in the vacuum chamber in such a manner that the plasma sweeps a significant portion of the surface.

Figure 5A:
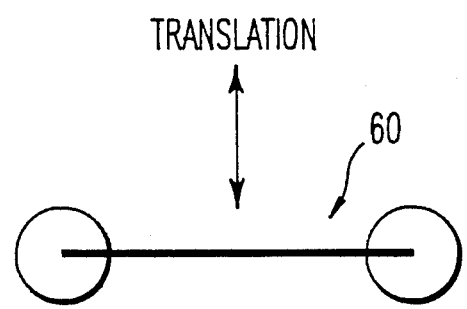
FIG. 5 is a schematic drawing of several possibilities of moving secondary radiators.
Figure 5B:
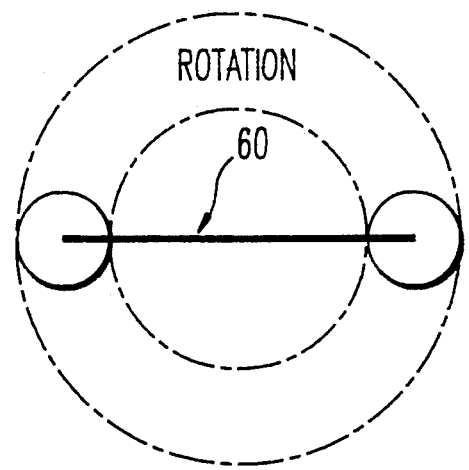

Another possibility for producing a large area where a plasma is generated results from moving the secondary radiators. The secondary radiators can be moved in two motions, for example, by the translation of a secondary radiator, as shown in FIG. 5(a), or by the rotation of a secondary radiator, as shown in FIG. 5(b). These movements can be effected so rapidly that, e.g., during rotation a torus-shaped plasma is produced. In this case, not every point of the torus is supplied with microwave power at every instant. Thus, for a short period of time the plasma is extinguished at this point. If the observed point of the torus is, however, again in the region of the spherical plasma, the molecules located here are excited again. This alternation of existing microwave power at one location corresponds to generating a pulsed plasma. In the interest of a maximum uniform surface treatment, the continuous movement of the substrate can be combined with a rotating or translating movement of the secondary radiators. To this end, the configuration of the secondary radiators can be rotated or oscillated at right angles to the direction of movement of the transport device.

The substrate to be processed with the plasma can also be oriented relative to the secondary radiator in different ways, as is shown in FIG. 3. Correspondingly, the effect of the plasma on the substrate can be influenced based on such orientations.

Figure 3A:
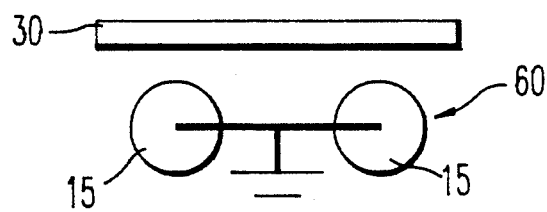
FIG. 3 shows various possibilities for orienting the secondary radiators relative to a substrate to be treated.
Figure 3B:
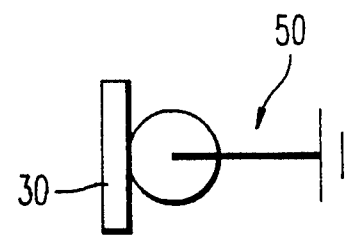
Figure 3C:
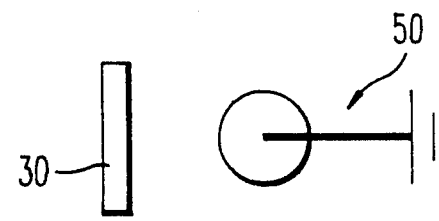

Depending on the targeted effect on the substrate, the substrate can be brought into contact with the plasma in the combustion chamber or disposed in its vicinity. In so doing, the aerials can be oriented parallel or vertically to the substrate. For example, as shown in FIG. 3(a), the secondary radiator 60 may be located parallel to the substrate 30 or, as shown in FIG. 3(b), the secondary radiator 10 may be located vertically with respect to the substrate 30 and in contact with the substrate 30 or, as shown in FIG. 3c, the secondary radiator 10 may be located vertically with respect to the substrate 30 and not in contact with the substrate 30. Periodic inhomogeneities caused by the wavelengths can be optionally compensated for by using several aerials side by side and moving the substrate vertically to the aerials, as is shown in FIGS. 4 and 5.

Low pressure plasma generators according to the present invention are suitable for the well-known plasma treatment methods such as activating, etching or coating. To activate, a surface is subjected, for example, to an oxygen plasma, thus forming polar groups. For plasma deposition, the plasma is ignited with organic gases from which thin layers with valuable properties form on the substrate surface. In arrangements with secondary radiators of the present invention, deposition rates of up to a few micrometers per minute can be obtained.

The present invention can also be used to apply a microwave field by means of secondary radiators not only for the direct formation of a plasma but also to generate a large area radiation as a primary radiator. In this case, the vacuum chamber is under a pressure that is not suitable for forming a plasma on the aerial tips. It can lie above or below the pressure that is suitable for plasma formation, e.g., below $10^{-3}$ or above 100 mbar. The microwave radiation is irradiated with a pressure suitable for plasma formation through a microwave-permeable window into a vacuum chamber that is located behind the window.

Figure 6:
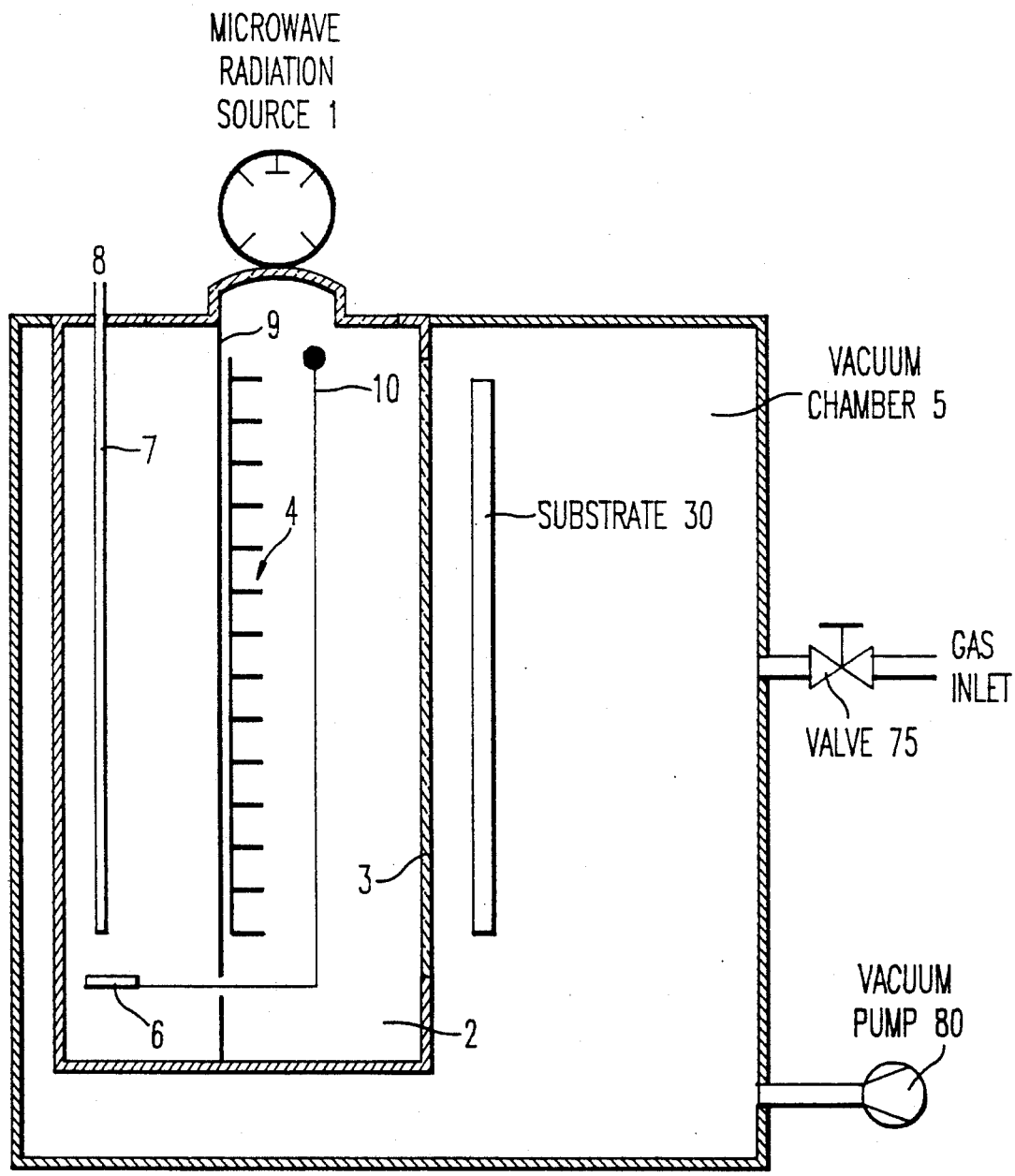
FIG. 6 is a sectional view of a low pressure plasma generator that has a built-in comb secondary radiator which acts as a primary radiator.

An expedient design of such a primary radiator is shown in FIG. 6. As shown in FIG. 6, microwave radiation from a microwave radiation source 1 is bunched in the face of a waveguide 2, which is located in a vacuum chamber 5. One or several parallel comb aerials 4 are arranged therein parallel to the wave deflector 9 in such a manner that the aerial tips are aimed at a vacuum-sealed, microwave-permeable window 3. With a one-sided common ground, the length of the radiator elements of the comb aerials 4 is approximately a quarter wavelength. The distance of the elements defines the aerial inner resistance and yields good results when at 1/5 to 1/10 of the wavelength. By changing the length of the elements, the distribution of the intensity of the plasma can be controlled outside the radiator.

The homogeneity of the irradiated microwave radiation can be significantly increased—of course, at the cost of efficiency, if a microwave absorber is attached to the aerial end. Instead, the radiation can also be uncoupled there by means of a coupling member 6 of the relative mode and rerouted into a special absorber chamber 7; a water hose 8 is such a suitable absorber.

The plasma can also be homogenized in that the radiator elements 4 are replaced by an excited radiator 10 parallel to the wave deflector 9. The radiator 10 is connected to the coupling member 6. In this arrangement, the guided wave overlaps with the irradiation emitted by the radiator 10. On the grounds of the relationship $$\Lambda = \lambda_o[(1-[\lambda_o/2a]^{\frac{1}{2}}]^{-1}$$

where $\Lambda$ is the guided wavelength, $\lambda_o$ is the free space wavelength and a is the guided wave width, the guided wavelength at 2.45 GHz can be set to, e.g., 3 m, by selecting the waveguide width a $=61$. At a plasma length of 70 cm the free space wavelength of 0.122 is severely suppressed. In this case an absorber plays only a subordinate role.

Obviously, numerous modifications and variations of the present invention are possible in light of the above teachings. It is therefore to be understood that within the scope of the appended claims, the invention may be practiced otherwise than as specifically described herein.

WHAT IS CLAIMED AS NEW AND DESIRED TO BE SECURED BY LETTERS PATENT OF THE UNITED STATES IS:

1. A low pressure plasma generator for subjecting a substrate to a plasma, comprising:
   a vacuum chamber in which said substrate is located;
   at least one microwave radiation source for generating microwaves which enter said vacuum chamber, wherein the microwave radiation source does not by itself produce a field strength sufficient to form plasma in the vacuum chamber;
   at least one aerial acting as a secondary radiation source for the secondary radiation of microwaves in the vacuum chamber, wherein the secondary radiation of microwaves forms a plasma at a tip of the at least one aerial.

2. The low pressure plasma generator according to claim 1, wherein there are a plurality of aerials in the vacuum chamber.

3. The low pressure plasma generator according to claim 2, wherein the aerial tips lie on a continuous curve.

4. The low pressure plasma generator according to claim 3, wherein the aerial tips lie on a straight line.

5. The low pressure plasma generator according to claim 4, wherein the aerial tips lie in a plane.

6. The low pressure plasma generator according to claim 3, wherein the aerial tips lie in a continuously curved area.

7. The low pressure plasma generator according to one of claims 2 to 6, wherein the aerials are spaced ¼ to 1/20 of a wavelength apart substantially parallel to each other on a common guide.

8. The low pressure plasma generator according to one of claims 1 to 6, further comprising:
a transport device disposed in the vacuum chamber which can transport the at least one aerial in such a manner that the plasma sweeps a significant proportion of the substrate.

9. The low pressure plasma generator according to claim 8, wherein the at least one aerial can be rotated or oscillated at right angles to the direction of movement of the transport device.

10. The low pressure plasma generator according to one of claims 4, 5 or 6 wherein the vacuum chamber is under pressure, which is not suitable for forming a plasma, and wherein the radiation generated by the secondary radiator is aimed at a vacuum-sealed, microwave-permeable window.

* * * * *